United States Patent [19]
Fletcher et al.

[11] 3,715,693
[45] Feb. 6, 1973

[54] GYRATOR EMPLOYING FIELD EFFECT TRANSISTORS

[76] Inventors: James C. Fletcher, Administrator of the National Aeronautics and Space Administration with respect to an invention by; Erwin S. Hochmair, Huntsville, Ala.

[22] Filed: March 20, 1972

[21] Appl. No.: 236,281

[52] U.S. Cl. ..................333/80 T, 307/230, 307/304, 330/20, 330/22, 330/30 D, 330/35, 330/40
[51] Int. Cl. ..........................H03h 7/44, H03h 11/00
[58] Field of Search ...........333/80 R, 80 T; 307/304; 330/12, 35, 30 D

[56] References Cited

UNITED STATES PATENTS 3,400,335 9/1968 Orchard et al. .................333/80 T X
3,518,584 6/1970 Miller et al..........................333/80 T
3,597,698 8/1971 Maltarese........................333/80 T X

*Primary Examiner*—Paul L. Gensler
*Attorney*—L. D. Wofford, Jr. et al.

[57] ABSTRACT

A gyrator circuit of the conventional configuration of two amplifiers in a circular loop, one producing zero phase shift and the other producing 180° phase reversal. All active elements are MOS field effect transistors. Each amplifier comprises a differential amplifier configuration with current limiting transistor, followed by an output transistor in cascode configuration, and two load transistors of opposite conductivity type from the other transistors. A voltage divider control circuit comprises a series string of transistors with a central, voltage input to provide control, with locations on the amplifiers receiving reference voltages by connection to appropriate points on the divider. The circuit produces excellent response and is well suited for fabrication by integrated circuits.

31 Claims, 5 Drawing Figures

DRAIN CURRENT V.Q., GYRATION RESISTANCE, AND (RESISTORS 26 = 0) POWER CONSUMPTION

GYRATOR EMPLOYING FIELD EFFECT TRANSISTORS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

This invention relates to gyrator circuits and, more specifically, to such circuits comprising field effect transistors.

Gyrator circuits are circuits which reverse or invert the apparent effect of circuit elements and thereby produce one impedance while actually employing an element having the opposite impedance. Gyrators are now of great importance to produce inductance from capacitors rather than coils in integrated circuits, printed circuits, and the like since coils or similar elements are not readily produced in such circuitry and, in fact, are quite impractical in some instances. Gyrators of the kind of interest may simulate elements including inductors, dc-transformers, coupled capacitors and floating capacitors, such simulation being important contributions to integrated circuit technology. Since the response of some gyrators may be controlled by external control voltages, time-variable elements have been simulated.

Gyrator technology is at present somewhat active, and includes various circuits employing voltage controlled current sources, cascode configurations, differential amplifiers, floating circuits, and circuits employing only field effect transistors as the active elements. In general, some voltage controlled current sources (VCCS) have produced good quality gyrators, but other circuits have been unsatisfactory, especially with regard to stability, and the desired high Q and wide frequency range.

The present invention employs the voltage controlled current source concept of two amplifiers, one inverting and one non-inverting, connected in a negative feedback loop. The input and output resistances are sufficiently high so that the circuit is essentially responsive to voltage and not current characteristics of the input.

In order to obtain a high output resistance, complementary transistors were typically employed in the output stage of the VCCS. Those circuits, however, employed bipolar transistors and the transistors of different conductivity type when in integrated circuits deteriorated, leading to a comparatively low Q of the gyrator. Because of the reduction of current gain with decreasing collector current, such gyrators with low power consumption show very low Q. Additionally, bipolar transistors introduce excessive phase shift when used in Darlington configuration to achieve high input resistance, leading to unwanted oscillations, and bipolar transistors are not well suited to circuits in which the gyration resistance is adjusted electronically.

Since the input resistance to a field effect transistor is quite high, those elements are well suited to VCCS circuits. The input resistance to a metal-oxide semiconductor field effect transistor (MOS FET) is in the order of $10^{11}$ ohms. However, the product of transconductance, g, times output resistance, $R_o$, for a MOS FET is about one order of magnitude smaller than that of bipolar transistors. That limits the Q of the gyrator to a rather low value, less than 50, if an ordinary complementary output stage is used.

To overcome this drawback, a complementary cascode circuit is used, which provides in a typical case an output resistance of 20 megaohms at a drain current of 0.4 milliamperes, thereby exceeding the corresponding values obtained by bipolar complementary stages. Q values in excess of 500 have been confirmed.

No circuit closely comparable to the present invention is known to have a complementary cascode or Darlington output configuration driven by a differential amplifier.

SUMMARY OF THE INVENTION

It is a primary object of this invention to provide a gyrator circuit which functions well and is fabricated practically and economically in integrated circuits and the like.

It is also a primary object of this invention to provide a gyrator circuit with electrical variation of gyration resistance so that control is by variation of an applied voltage.

It is, similarly, a primary object of this invention to provide a gyrator circuit the gyration resistance and, correspondingly, the effective impedance presented to the driving circuit, of which may be readily varied.

It is another object of this invention to provide a gyrator circuit with low power requirements.

It is a similar object of this invention to provide a gyrator circuit with high Q.

It is a similar object of this invention to provide a gyrator circuit in which the gyration resistance may be varied considerably with no substantial degradation of Q.

It is a more specific object of this invention to provide a gyrator circuit with active elements which are all field effect transistors.

It is a more specific object of this invention to provide a circuit design incorporating a cascode configuration and transistors of complementary types in the output.

It is another, more specific object of this invention to provide a gyrator circuit in which the internal resistance, which influences gyration resistance, has no influence on dc levels.

It is another object of this invention to provide a gyrator circuit having high Q at high gyration resistance and low power consumption.

It is another, more specific object of this invention to provide a gyrator circuit with variable gyration resistance which avoids use of MOS transistors as variable resistors, since MOS transistors are severely limited by nonlinear characteristics.

It is a more general object of this invention to provide a gyrator which operates well at high frequencies.

It is, similarly, an object of this invention to provide a gyrator circuit which operates well and with comparatively high Q over a wide frequency range.

It is another, more general object of this invention to provide a basic gyrator circuit which may be readily adapted to semifloating and floating designs.

In accordance with this invention, the circuit comprises two, essentially similar amplifiers, one connected to the other with phase inversion and the other connected to the first without phase change, the input of one presenting a terminal to be driven by an external circuit and the input of the other presenting a terminal to be connected to an element the impedance of which is to be inverted. The active elements preferably are all field effect transistors, particularly MOS FETs. Each amplifier has a differential amplifier stage of two of the FETs. The output is connected in cascode with a transistor of the same conductivity type. The output to that is connected to an FET of opposite conductivity type, preferably two such FETs in cascode. Each transistor of the differential amplifier preferably is also connected to a current limiting FET. A voltage divider circuit comprising a string of FET transistors in source-to-drain configuration is connected to 0 volts and to a higher voltage source. A variable control voltage is connected to the central transistor, and reference voltage levels for the amplifiers are tapped from the voltage divider, to thereby electrically vary the drain current of the amplifiers and the corresponding effective output.

Floating circuits may be provided by the inclusion of corresponding elements so that the terminals appear across the corresponding points of differential circuits and are connected as the differential inputs of the amplifiers.

Other objects, features, advantages, and characteristics of the invention will be apparent from the following description of preferred embodiments, as illustrated from the accompanying drawings.

DESCRIPTION OF THE PREFERRED EMBODIMENTS

Figure 1:
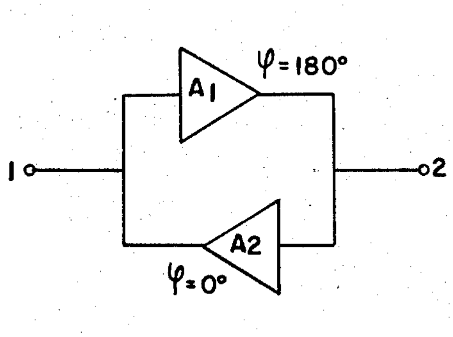
FIG. 1 is a schematic illustration of the general circuit.

The system is comprised of two amplifiers in a circular loop with the output of one producing zero phase change and the other producing 180° phase reversal. The basic arrangement is a conventional gyrator system and is shown in general form in FIG. 1. The circuit is reciprocal, and the input signal may drive either the amplifier with phase reversal or the one without. Connection of an electrical element of a given kind at the terminal 1 or 2 in FIG. 1 causes the reciprocal element to effectively appear at the other terminal 1 or 2. For example, a conventional capacitor connected to terminal 2 results in an inductance appearing at terminal 1.

Field effect transistors may be perfectly symmetrical and reciprocal between source and drain. The source and drain terminals, however, usually may still be identified conceptually, and, accordingly, the terminals generally are so identified in the terminology used herein. The gate element is a control input to the field effect transistor and functions with the source to control signals passed between the source and the drain. The conductivity type of the transistors refers to the conductivity characteristics, whether the conventional N or P, of the source-to-drain path (channel) of the transistor, and the main body of the transistor is of the opposite conductivity type.

Figure 2:
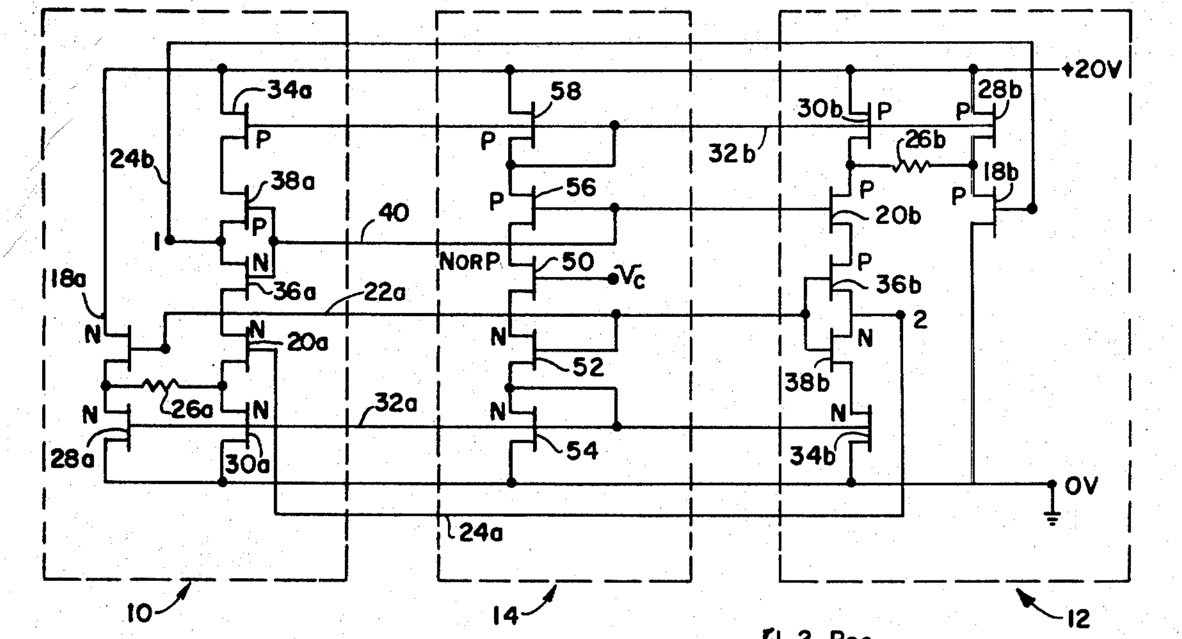
FIG. 2 is a detailed circuit diagram of the basic, preferred embodiment.

The basic, preferred circuit in accordance with this invention is shown in FIG. 2. All active devices in the circuit are metal oxide semiconductor field effect transistors (abbreviated as MOS FET and also known as insulated-gate field effect transistors). The amplifier $A_1$ of FIG. 1 corresponds to the assembly within dotted outline 10 in FIG. 2. Similarly, the amplifier $A_2$ in FIG. 1 corresponds to the assembly within dotted outline 12 in FIG. 2. The central string of elements, within dotted outline 14, is a voltage divider circuit.

Because of their largely identical arrangement and function, the individual elements of the two amplifiers will be given the same numeral, followed by the letter "a" for elements of amplifier $A_1$ and "b" for elements of amplifier $A_2$. In discussing the amplifiers in a context which applies to either, the letters will not be specified.

FET **18*a* and FET 20*a* function as a differential amplifier stage with respect to the signals appearing on line 22*a* to the gate of FET 18*a* and line 24*a* to the gate of FET 20*a*. Line 24*a* is directly connected to terminal 2, and line 22*a* is directly connected to the voltage divider circuit. The source terminal of FET 18 is connected to the source terminal of FET 20 through resistor 26. The source terminal of FET 18*a* is also connected to 0 volts or ground through the drain terminal of FET 28*a* and the source terminal of FET 20*a* is connected to 0 volts or ground through the drain terminal of FET 30*a*. The gate terminals of FET 28*a* and FET 30*a* are connected together by line 32*a*, which is connected to a point on the voltage divider and is also connected to the gate of the final load transistor FET 34*b*** in the other amplifier stage.

All of the transistors FETs **18*a*, 20*a*, 28*a*, 30*a*, and 36*a* are of the same conductivity type, in this case the channel is of the N conductivity type, and, accordingly, a positive signal present at the gate tends to increase source-to-drain conduction. The corresponding FETs 18*b*, 20*b*, 28*b*, 30*b*, and 36*b* of amplifier $A_2$ are of the opposite conductivity type. Similarly, FET 34*a* and FET 34*b* are of opposite conductivity type. The sources of FETs 28*b* and 30*b*** are connected to a +20 volt source.

The drain of FET 20 is connected to the source of FET 36. This connection between FET 20 and FET 36 is a standard cascode configuration, which yields high gain. In general, the cascode configuration is a known design in which an input stage with the source connected to a reference potential drives a second stage having the grid connected to a reference potential.

The drain of FET 36 is connected to the drain of FET 38, which is of conductivity type opposite to that of the the previous transistors (P for FET **38*a* and N for FET 38*b*). Transistor FET 38 is connected in standard cascode configuration with FET 34, which is of the same conductivity type as the transistor FET 38 to which it is connected. The drain-drain connection location of FETs 36***a* and 38*a* is directly connected to terminal 1 and to the amplifier $A_2$ through line 24*b*.

The gates of FETs 36*a* and 38*a* are connected together and to the voltage divider through line 40. The gate of FET 34*a* is connected to the gates of current control FETs 28*b* and 30*b* of the other amplifier by line 32*b*. The source of FET 34*a* is connected directly to the +20 volt source, and the source of FET 34*b* is connected directly to the ground.

To provide zero phase shift, the input connection on line 24*b* from the output of amplifier $A_1$ to the differential amplifier stage of FET 18*b* and FET 20*b* is reversed from the corresponding connections of terminal 2 to $A_1$. Accordingly, the line 24*b* is connected to the gate of FET 18*b* and the line 40 is connected to the gate of FET 20*b*. The interconnected design of amplifiers $A_1$ and $A_2$ is facilitated by each corresponding element in the amplifiers being of opposite conductivity type.

The voltage divider circuit 14 comprises a string of MOS FETs of different conductivity type connected between the +20 volt source and the 0 volt source. The central FET 50 may be of either conductivity type; its gate is connected to the variable source $V_c$ of control voltage.

One of the other terminals of FET 50 is connected to the drain of FET 52, of N conductivity type, the same conductivity type as that of the transistors of the differential amplifier stage of $A_1$. That terminal is also directly connected to line 22*a*, which is connected to the gate of FET 18*a* and the gates of FETs 36*b* and 38*b*, and also to the gate of FET 52 itself.

The source of FET 52 is connected to the drain of FET 54, also of N conductivity type. That junction is also connected to line 32*a*, which is directly connected to the gates of FETs 28*a*, 30*a*, and 34*b*, and also to the gate of FET 54 itself. The source of FET 54 is connected to the 0 volts, which is at one end of the voltage divider circuit.

At the other half of the voltage divider, the other terminal of FET 50 is connected to the drain terminal of FET 56, of P conductivity type. That terminal is also directly connected to the line 40, which is connected to the gates of FETs 36*a* and 38*a* and the gate of FET 20*b*, and also to the gate of FET 56 itself.

The source of FET 56 is connected to the drain of FET 58, also of P conductivity type. That junction is also connected to line 32*b*, which is connected to the gates of FETs 28*b*, 30*b*, and 34*a*, and also to the gate of the FET 58 itself. The source of FET 58 is connected to the +20 volt source at one end of the voltage divider.

In operation, an impedance element the impedance of which is to be effectively inverted, which typically is a capacitor, is connected to one of the terminals 1 or 2. The inverted impedance will appear at the other terminal. For example, when a capacitor is connected across the terminal 2 and ground, an inductance appears at terminal 1.

Since the amplifiers 10 and 12 each consist of only one stage, only a small inherent phase lag is experienced in the amplifiers. The resistors 26 affect the transconductance $g_{1\ or\ 2}$, and the gyration resistance, $r_{1\ or\ 2}$, is, of course, the direct reciprocal of the corresponding transconductance. The resistors 26 may be supplied in various forms, such as by integration on the chip, by application of an external resistor, or by the resistors being MOS variable resistors.

More generally, by conventional circuit analysis for a symmetrical circuit, the gyration resistance is a function of the transconductance of each amplifier, *gm*, and the resistance of the input stage, which in equation form is:

$$r_{1\ or\ 2}=\frac{2+gm\cdot R_{26a\ or\ 26b}}{gm}$$

Also, the transconductance, *gm*, is proportional to the square root of the drain current, $I_D$, of the amplifier involved.

The voltage divider 14 provides reference voltages to the gates of the transistors of the amplifiers 10 and 12, and thus controls the $I_D$. Thus, the voltage $V_c$, which is an externally variable input, determines the current in the voltage divider and thereby controls gm of the amplifiers and the corresponding gyration resistance, $r_{1,2}$.

The amount of variation of the gyration resistance depends on the values of $R_{26}$. For large $R_{26}$ the variation is very small, leading to gyrators of high reliability the gyration resistance of which is very insensitive to supply voltage variation or temperature changes. The largest variation of the gyration resistance appears when $R_{26a,\ 26b}=0$.

When one of the terminals 1 or 2 is loaded by an impedance Z, the impedance simulated at the other terminal is $(r_1 \cdot r_2)/CZ)$, or $r_1 \cdot r_2 \cdot \omega C$ when one of the terminals is loaded by a capacitor of capacitance C.

Variations of L of 1:18 have been obtained. This method of varying the gyration resistance is far more convenient than the use of MOS transistors as variable resistors, which have nonlinearities severely limiting the maximum input voltage.

Since the supply voltage has only a very small influence on the drain current, the gyration resistance is very insensitive to supply voltage changes. More specifically, the sensitivity to supply voltage changes is only 1/400 of the sensitivity to variations of the control voltage $V_c$. If the control input $V_c$ is connected to the drain of FET 50 (such as line 40 when FET 50 is an N-channel FET), then the control can be obtained by varying the supply voltage instead of $V_c$. However, a control by means of $V_c$ has the advantage of not consuming any power from the control signal source.

Figure 3:
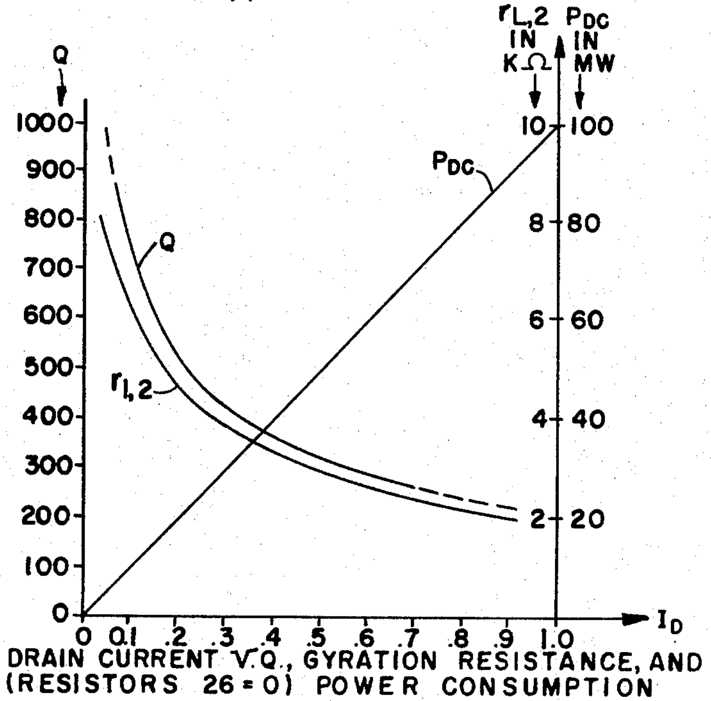
FIG. 3 is a graphical representation of characteristics of a representative circuit in accordance with this invention.

FIG. 3 illustrates actual circuit measurements where the resistors 26 ($R_{26a\ and\ 26b}$) are zero and the circuit is otherwise that of FIG. 2. An advantage particularly illustrated in FIG. 3 is that the output resistance of the amplifier is indirectly proportional to the value of $I_D$, yielding high Q at high gyration resistance accompanied by low power consumption (not believed to be known in circuits employing bipolar transistors). More precisely, the output resistance increases with the square of the gyration resistance.

The aspect ratio of the field effect transistors, the width W of the channel divided by the length L of the channel, was approximately 300 for the transistors of the circuit which is the subject of FIG. 3. For equal current, the quality Q of the circuit is proportional to the aspect ratio W/L.

No degradation of Q occurs for gyration resistances up to 100 kilohms. A gyration resistance of 100 kilohms results in a simulated inductance L of $10^4$ H per microfarad of load capacitor. The cascode output directly incorporated in the differential amplifier yields comparatively high frequency operation, especially when the technology provides for self-alignment of the gate. The values of the resistances 26, which determine the gyration resistances, have no influence on dc levels.

The semifloating gyrator (illustrated in FIG. 4) and the floating gyrator (illustrated in FIG. 5) are alternate embodiments which employ the basic circuit previously discussed.

Figure 4:
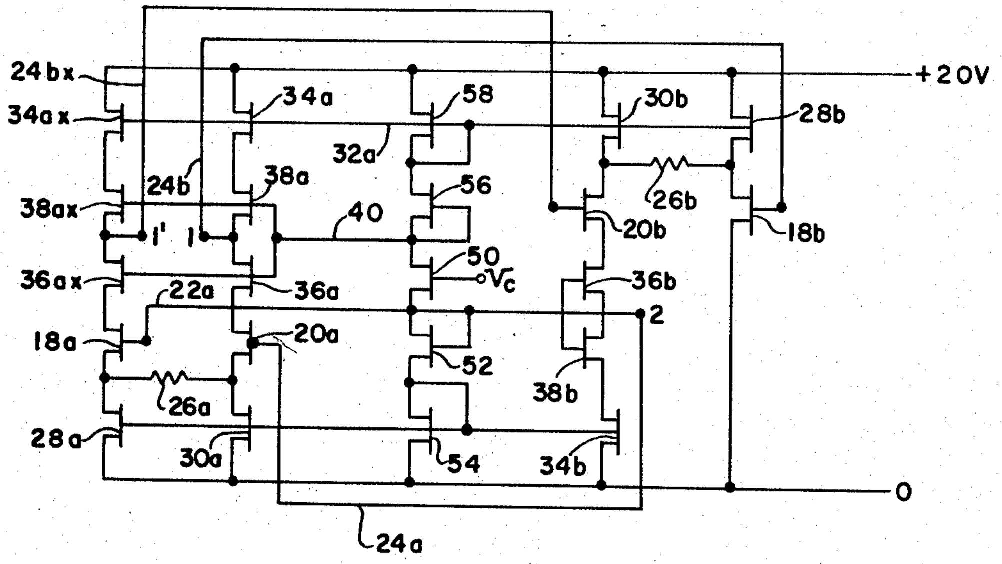
FIG. 4 shows a semifloating circuit in accordance with this invention and based directly upon the circuit of FIG. 2.

In the semifloating gyrator of FIG. 4, only the output terminal 1 is provided with a corresponding terminal 1', which is connected to a branch containing FETs **36*ax*, 38*ax*, and 34*ax*, which correspond directly in position in the circuit to output elements FETs 36*a*, 38*a*, and 34*a*. The branch comprising FETs 36*ax*, 38*ax*, and 34*ax* is connected to the +20 volt source in parallel with the branch comprising FETs 36*a*, 38*a*, and 34*a*. Accordingly, the terminals 1 and 1' are in a differential circuit, and this differential circuit is connected to the gates of transistors 18*b* and 20*b* by lines 24*b* and 24*bx* as the differential signal to the amplifier 12**.

The semifloating circuit of FIG. 4 provides simulation of a floating element, such as an inductor, at the port 1–1' by loading the gyrator by a grounded element, such as a capacitor, at 2. This is broadly useful, in filters and other circuits, where a non-grounded element is needed.

Figure 5:
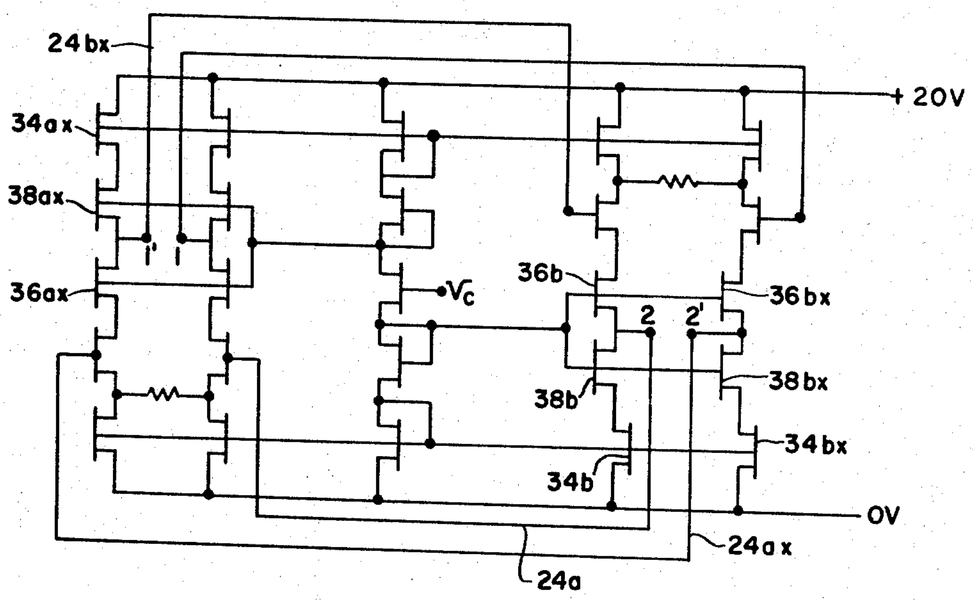
FIG. 5 shows a full floating circuit in accordance with this invention and based directly upon the circuit of FIG. 2.

In FIG. 5, both terminals are floating. The connection is essentially a duplication of the design of FIG. 4, with the circuitry of terminals 1 and 1' being as described and with the additional circuit of FETs **36*bx*, 38*bx*, and 34*bx* connected in a design so that the elements of the branch directly correspond in a differential circuit to elements 36*b*, 38*b*, and 34*b*. The branch comprising elements 36*bx*, 38*bx*, and 34*bx* is connected to the 0 volt source in parallel with the branch comprising FETs 36*b*, 38*b*, and 34*b*. Lines 24*a* and 24*ax* connect the points 2 and 2'** as the two differential inputs to the other amplifier.

Use of a differential circuit design to obtain a non-grounded terminal or port is known generally in this technology All three types of gyrators (nonfloating, semifloating, and full floating) are based upon the same novel design with the differential amplifier used in all forms and the differential output used with the floating terminals.

Other variations of the invention described will be apparent, and variations may well be developed which employ more than ordinary skill in this art, but nevertheless employ the basic contribution and elements of this invention. Accordingly, patent protection should not be essentially limited by the preferred embodiment disclosed, but should be as provided by law with particular reference to the accompanying claims.

What is claimed is:

1. A gyrator circuit comprising a first, differential amplifier stage comprising at least two active elements having control inputs, at least one of said active elements producing an output of said first amplifier and being a field effect transistor, one of said control inputs of said first amplifier being connected to a first terminal, the other of said control inputs of said first amplifier being connected to a source of reference potential, at least one field effect transistor connected to the output of said field effect transistor of said first amplifier in a first cascode configuration; a second, differential amplifier stage comprising at least two active elements having control inputs, at least one of said active elements producing an output of said second amplifier and being a field effect transistor, one of said control inputs of said second amplifier being connected to a second terminal and to the output of said first cascode configuration with said output being substantially the same phase as the input of said first amplifier, the other of said control inputs of said second amplifier being connected to a source of reference potential, at least one field effect transistor connected to the output of said field effect transistor of said second amplifier in a second cascode configuration, the output of said second cascode configuration being connected to said first terminal with said output being substantially the reversed phase of the input of said second amplifier.

2. The gyrator circuit as in claim 1 also including a voltage divider circuit having an input terminal for a control voltage, said reference potentials being provided by connection to said voltage divider circuit.

3. The gyrator circuit as in claim 2 in which said voltage divider circuit comprises at least three field effect transistors connected in series between two, different potential sources, said input terminal is connected to the gate of the central of said series connected transistors, and said reference potentials are provided by connection directly to different, individual ones of the other two terminals of said central transistor.

4. The gyrator circuit as in claim 1 in which said field effect transistors of said first amplifier and said first cascode configuration are of one conductivity type and said field effect transistors of said second amplifier and said second cascode configuration are of the opposite conductivity type.

5. The gyrator circuit as in claim 4 also including a voltage divider circuit having an input terminal for a control voltage, said reference potentials being provided by connection to said voltage divider circuit.

6. The gyrator circuit as in claim 5 in which said voltage divider circuit comprises at least three field effect transistors connected in series between two, different potential sources, said input terminal is connected to the gate of the central of said series connected transistors, said reference potentials are provided by connection directly to different, individual ones of the other two terminals of said central transistor, and the transistor of said series connected transistors connected between each said reference-potential connection and an end of said voltage divider circuit being of the same conductivity type as the said transistors of the amplifier stage and cascode configuration to which the reference potential is connected.

7. The gyrator circuit as in claim 4 in which said output of said first cascode configuration is connected in drain-to-drain series to at least one field effect transistor of opposite conductivity type from the transistors of said first amplifier and said first cascode configuration and in which said output of said second cascode configuration is connected in drain-to-drain series to at least one field effect transistor of opposite conductivity type from the transistors of said second amplifier and said second cascode configuration.

8. The gyrator circuit as in claim 7 also including a voltage divider circuit having an input terminal for a control voltage, said reference potentials being provided by connection to said voltage divider circuit.

9. The gyrator circuit as in claim 8 in which said voltage divider circuit comprises at least three field effect transistors connected in series between two, different potential sources, said input terminal is connected to the gate of the central of said series connected transistors, said reference potentials are provided by connection directly to different, individual ones of the other two terminals of said central transistor, the transistor of said series connected transistors connected between each said reference-potential connection and an end of said voltage divider circuit being of the same conductivity type as the said transistors of the amplifier stage and cascode configuration to which the reference potential is connected, the gate of the transistor in said first cascode configuration connected to the transistor of opposite conductivity type and the gate of that transistor of opposite conductivity type are connected to said reference potential connected to said second amplifier, and the gate of the transistor of said second cascode configuration connected to the transistor of opposite conductivity type and the gate of that transistor of opposite conductivity type are connected to said reference potential connected to said first amplifier.

10. The gyrator circuit as in claim 7 in which said first and said second differential amplifier stages each comprise at least four field effect transistors, two of said transistors in each said amplifier being connected respectively to said terminal and to said reference potential and being connected together source-to-source through a resistor, each of said two transistors being connected source-to-drain through individual of the other of said four transistors to a potential source.

11. The gyrator circuit as in claim 10 in which the output from said first cascode configuration is connected to one of said two transistors in said second amplifier which are connected respectively to said terminal and to said reference potential and in which the output from said second cascode configuration is connected to the transistor in said first amplifier which corresponds to the transistor in said second amplifier other than the one of said two transistors to which said output from said first cascode configuration is connected to said second amplifier.

12. The gyrator circuit as in claim 9 in which said first and said second differential amplifier stages each comprise at least four field effect transistors of the same conductivity type, two of said transistors in each said amplifier being connected respectively to said terminal and to said reference potential and being connected together source-to-source through a resistor, each of said two transistors being connected source-to-drain through individual of the other of said four transistors to a potential source and in which the gates of said transistors in said voltage divider circuit connected to the central transistor are connected to the nearest terminal of said central transistor, and said voltage divider circuit also includes field effect transistors connected in source-to-drain series between each said transistor connected to the central transistor and one of said two potential sources, each being of the same conductivity type as the said transistor connected to the central transistor to which it is connected, the gate of each being connected to the gates of the two said other transistors which are connected to a potential source of a said amplifier comprising transistors of that same conductivity type and to the location of connection of the two transistors of that same conductivity type in said voltage divider circuit.

13. The gyrator circuit as in claim 12 in which the output from said first cascode configuration is connected to one of said two transistors in said second amplifier which are connected respectively to said terminal and to said reference potential and in which the output from said second cascode configuration is connected to the transistor in said first amplifier which corresponds to the transistor in said second amplifier other than the one of said two transistors to which said output from said first cascode configuration is connected to said second amplifier.

14. The gyrator circuit as in claim 10 in which each said transistor of opposite conductivity type connected to each said cascode configuration is connected in source-to-drain series with another field effect transistor of the same conductivity type.

15. The gyrator circuit as in claim 12 in which each said transistor of opposite conductivity type connected to each said cascode configuration is connected in source-to-drain series with another field effect transistor of the same conductivity type, and in which the gate of each said another transistor is connected to the location of connection of the two transistors which are both of that same conductivity type connected to the central transistor in said voltage divider circuit.

16. The gyrator circuit as in claim 15 in which the output from said first cascode configuration is connected to one of said two transistors in said second amplifier which are connected respectively to said terminal and to said reference potential and in which the output from said second cascode configuration is connected to the transistor in said first amplifier which corresponds to the transistor in said second amplifier other than the one of said two transistors to which said output from said first cascode configuration is connected to said second amplifier.

17. The gyrator circuit as in claim 1 in which at least one of said terminals is connected in parallel with a circuit branch which provides a differential response not referenced to ground to an input at that terminal, the differential response being connected as the differential input to the said differential amplifier stage to which that terminal is connected.

18. The gyrator circuit as in claim 4 in which at least one of said terminals is connected in parallel with a circuit branch which provides a differential response not referenced to ground to an input at that terminal, the differential response being connected as the differential input to the said differential amplifier stage to which that terminal is connected.

19. The gyrator circuit as in claim 7 in which at least one of said terminals is connected in parallel with a circuit branch which provides a differential response not referenced to ground to an input at that terminal, the differential response being connected as the differential input to the said differential amplifier stage to which that terminal is connected.

20. The gyrator circuit as in claim 7 also including a voltage divider circuit having an input terminal for a control voltage, said voltage divider circuit comprising at least three field effect transistors connected in series between two, different potential sources, said input terminal being connected to the gate of the central of said series connected transistors, the gate of the transistor in said first cascode configuration connected to the transistor of opposite conductivity type and the gate of that transistor of opposite conductivity type being connected to one of the two other terminals of said central transistor, the gate of the transistor of said second cascode configuration connected to the transistor of opposite conductivity type and the gate of that transistor of opposite conductivity type being connected to the other of said two other terminals of said central transistor, the transistor of said series connected transistors connected between the nearest of said two other terminals of said central transistor and an end of said voltage divider circuit being of the opposite conductivity type to that of the transistor of the cascode configuration to which that said nearest terminal of the central transistor is connected, and in which at least one of said terminals is connected in parallel with a circuit branch which provides a differential response not referenced to ground to an input at that terminal, the differential response being connected as the differential input to the said differential amplifier stage to which that terminal is connected.

21. The gyrator circuit as in claim 10 in which at least one of said terminals is connected in parallel with a circuit branch which provides a differential response not referenced to ground to an input at that terminal, the differential response being connected as the differential input to the said differential amplifier stage to which that terminal is connected.

22. The gyrator circuit as in claim 11 in which at least one of said terminals is connected in parallel with a circuit branch which provides a differential response not referenced to ground to an input at that terminal, the differential response being connected as the differential input to the said differential amplifier stage to which that terminal is connected.

23. The gyrator circuit as in claim 20 in which said first and said second differential amplifier stages each comprise at least four field effect transistors of the same conductivity type, two of said transistors in each said amplifier being connected respectively to said terminal and to said reference potential and being connected together source-to-source through a resistor, each of said two transistors being connected source-to-drain through individual of the other of said four transistors to a potential source and in which the gates of said transistors in said voltage divider circuit connected to the central transistor are connected to the nearest terminal of said central transistor, and said voltage divider circuit also includes field effect transistors connected in source-to-drain series between each said transistor connected to the central transistor and one of said two potential sources, each being of the same conductivity type as the said transistor connected to the central transistor to which it is connected, the gate of each being connected to the gates of the two said other transistors which are connected to a potential source of a said amplifier comprising transistors of that same conductivity type and to the location of connection of the two transistors of that same conductivity type in said voltage divider circuit, and in which at least one of said terminals is connected in parallel with a circuit branch which provides a differential response not referenced to ground to an input at that terminal, the differential response being connected as the differential input to the said differential amplifier stage to which that terminal is connected.

24. The gyrator circuit as in claim 23 in which the output from said first cascode configuration is connected to one of said two transistors in said second amplifier which are connected respectively to said terminal and to said reference potential and in which the output from said second cascode configuration is connected to the transistor in said first amplifier which corresponds to the transistor in said second amplifier other than the one of said two transistors to which said output from said first cascode configuration is connected to said second amplifier.

25. The gyrator circuit as in claim 14 in which at least one of said terminals is connected in parallel with a circuit branch which provides a differential response not referenced to ground to an input at that terminal, the differential response being connected as the differential input to the said differential amplifier stage to which that terminal is connected.

26. The gyrator circuit as in claim 23 in which each said transistor of opposite conductivity type connected to each said cascode configuration is connected in source-to-drain series with another field effect transistor of the same conductivity type, and in which the gate of each said another transistor is connected to the location of connection of the two transistors which are both of that same conductivity type connected to the central transistor in said voltage divider circuit.

27. The gyrator circuit as in claim 26 in which the output from said first cascode configuration is connected to one of said two transistors in said second amplifier which are connected respectively to said terminal and to said reference potential and in which the output from said second cascode configuration is connected to the transistor in said first amplifier which corresponds to the transistor in said second amplifier other than the one of said two transistors to which said output from said first cascode configuration is connected to said second amplifier.

28. A gyrator circuit comprising two amplifiers circularly connected, one to apply output signals phase-reversed from its input to the input of the other and the other to apply signals of the same phase as its input to the input of the one, each amplifier comprising a first field effect transistor having a control input, a second field effect transistor of the same conductivity type as said first field effect transistor connected to the output of said first field effect transistor in a cascode configuration, a third field effect transistor of opposite conductivity type connected in drain-to-drain series to said second transistor, and at least one fourth field effect transistor connected in source-to-drain series with said first, second, and third transistors to limit source-to-drain to-drain current of said first, second, and third transistors.

29. The gyrator circuit as in claim 28 in which said at least one fourth transistor comprises one field effect transistor of the same conductivity type as said third transistor connected to said third transistor in cascode configuration.

30. The gyrator circuit as in claim 28 in which said at least one fourth transistor comprises one transistor of the same conductivity type as said first transistor directly connected in source-to-drain connection with said first transistor and another transistor of the same conductivity type as said third transistor directly connected in source-to-drain connection with said third transistor, the connection between said two amplifiers being from the junction of said second and third transistors of each amplifier to the control input of the other amplifier.

31. The gyrator circuit as in claim 30 also including a voltage divider circuit having an input terminal for a control voltage, the gate of said one transistor of one amplifier and said another transistor of the other amplifier being connected to one point of said voltage divider and the corresponding other gates being connected to the opposite, corresponding point of said voltage divider.

* * * * *